(12) United States Patent
Plewicki et al.

(10) Patent No.: US 11,258,230 B2
(45) Date of Patent: Feb. 22, 2022

(54) PUMP ISOLATION BY POLARIZATION SPLITTING

(71) Applicant: Lumentum Operations LLC, Milpitas, CA (US)

(72) Inventors: Mateusz Plewicki, Sunnyvale, CA (US); Martin H. Muendel, Oakland, CA (US)

(73) Assignee: Lumentum Operations LLC, San Jose, CA (US)

( * ) Notice: Subject to any disclaimer, the term of this patent is extended or adjusted under 35 U.S.C. 154(b) by 738 days.

(21) Appl. No.: 16/057,590

(22) Filed: Aug. 7, 2018

(65) Prior Publication Data
US 2019/0140421 A1    May 9, 2019

Related U.S. Application Data
(60) Provisional application No. 62/583,278, filed on Nov. 8, 2017.

(51) Int. Cl.
| | |
|---|---|
| H01S 5/04 | (2006.01) |
| G02B 5/30 | (2006.01) |
| G02B 27/28 | (2006.01) |
| H01S 3/0941 | (2006.01) |
| H01S 3/094 | (2006.01) |
| H01S 3/06 | (2006.01) |
| H01S 5/00 | (2006.01) |
| G02B 5/00 | (2006.01) |

(52) U.S. Cl.
CPC ........... *H01S 5/041* (2013.01); *G02B 5/3025* (2013.01); *G02B 27/283* (2013.01); *H01S 3/0602* (2013.01); *H01S 3/09415* (2013.01); *G02B 5/003* (2013.01); *H01S 3/094073* (2013.01); *H01S 5/0064* (2013.01)

(58) Field of Classification Search
None
See application file for complete search history.

(56) References Cited

U.S. PATENT DOCUMENTS

| | | | | |
|---|---|---|---|---|
| 4,943,782 | A  * | 7/1990 | Stephens | H01S 3/005 |
| | | | | 359/338 |
| 6,429,965 | B1 * | 8/2002 | Falquier | H01S 3/06754 |
| | | | | 359/341.1 |
| 2007/0253055 | A1 * | 11/2007 | Chowdhury | H01S 3/2308 |
| | | | | 359/333 |
| 2017/0310072 | A1 * | 10/2017 | Link | H01S 5/14 |
| 2019/0250336 | A1 * | 8/2019 | Guo | H04B 10/675 |

* cited by examiner

*Primary Examiner* — Eric L Bolda
(74) *Attorney, Agent, or Firm* — Harrity & Harrity, LLP

(57) ABSTRACT

An optical pump may include a polarization element to separate pump light into a first component beam and a second component beam, wherein the polarization element is to separate the pump light such that the first component beam has a first polarization and the second component beam has a second polarization that is different from the first polarization. The optical pump may include a gain medium to absorb a portion of the first component beam and a portion of the second component beam, and transmit an unabsorbed portion of the first component beam and an unabsorbed portion of the second component beam. The optical pump may include one or more optical elements to at least partially isolate a pump source from the unabsorbed portion of the first component beam and the unabsorbed portion of the second component beam.

20 Claims, 8 Drawing Sheets

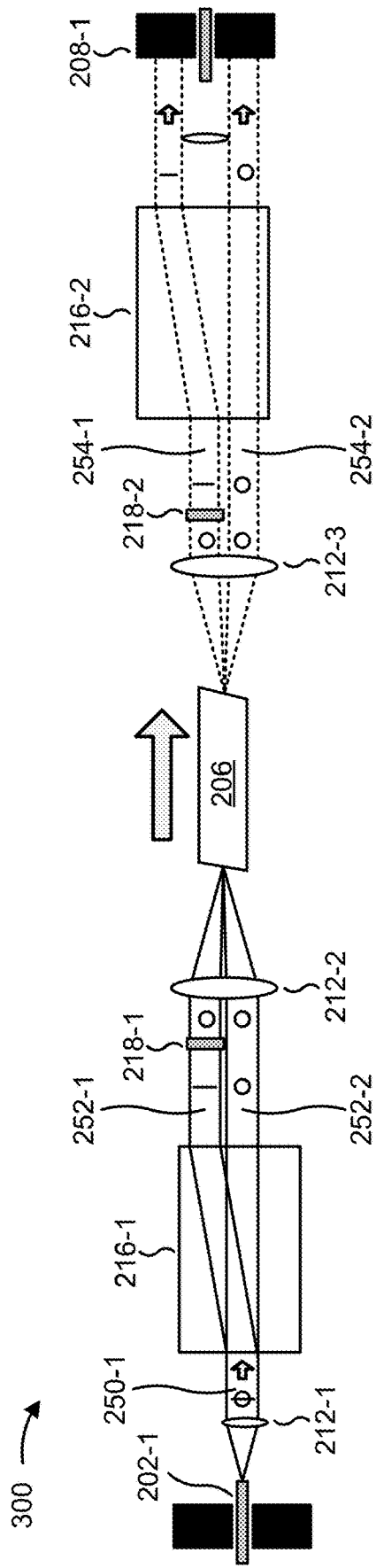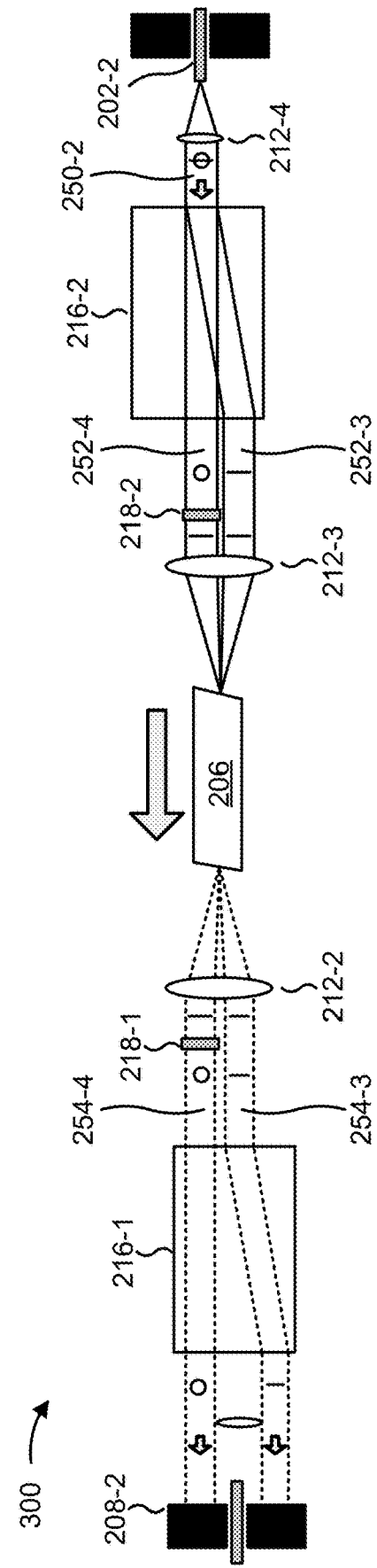
FIG. 3A
FIG. 3B

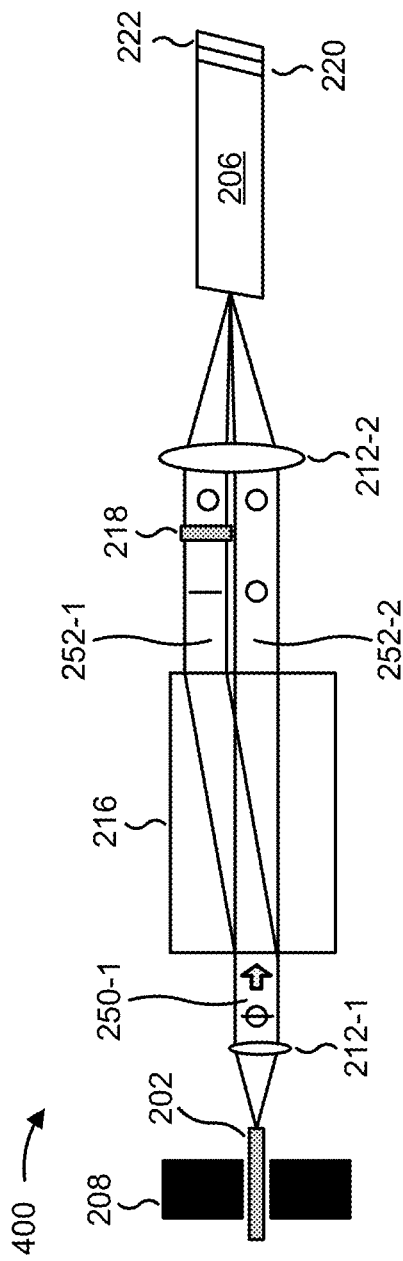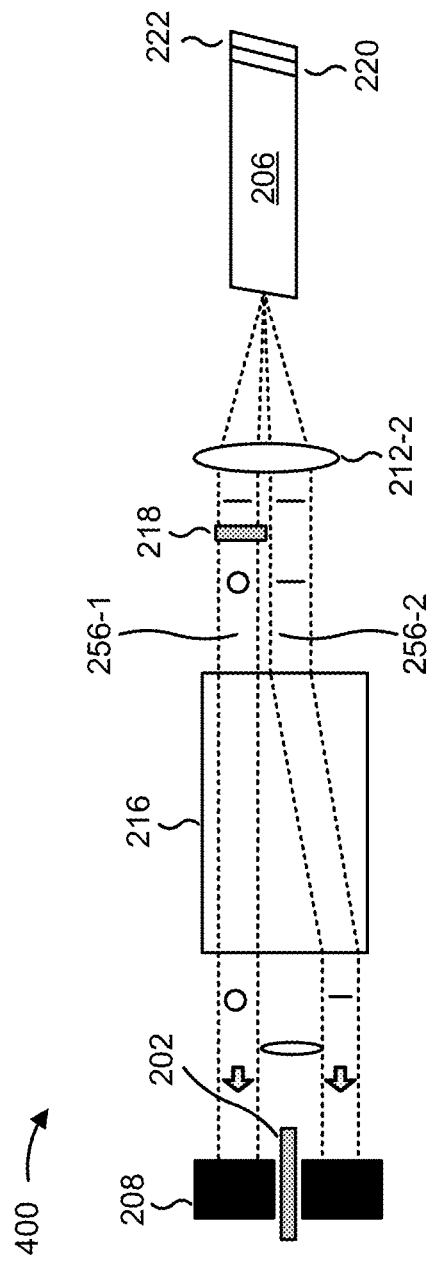
FIG. 4A
FIG. 4B

PUMP ISOLATION BY POLARIZATION SPLITTING

RELATED APPLICATION

This application claims priority under 35 U.S.C. § 119 to U.S. Provisional Patent Application No. 62/583,278, filed on Nov. 8, 2017, the content of which is incorporated by reference herein in its entirety.

TECHNICAL FIELD

The present disclosure relates to an optical pump and, more particularly, to an optical pump that provides pump source isolation based on polarization splitting.

BACKGROUND

An optical pump (sometimes referred to as an optical pumping system or an optically pumped system) typically includes a gain medium that is pumped by pump light provided by a pump source, such as a laser. Pumping the gain medium means that the pump light is injected into the gain medium in order to electronically excite the gain medium and/or some of constituents of the gain medium into other (e.g., higher) energy levels. In the context of a laser or a laser amplifier, the goal of optical pumping is to achieve a population inversion in the gain medium and, thus, to obtain optical amplification via stimulated emission for a particular range of optical frequencies (i.e., a particular gain bandwidth).

SUMMARY

According to some possible implementations an optical pump may include: a polarization element to: separate pump light into a first component beam and a second component beam wherein the polarization element is to separate the pump light such that the first component beam has a first polarization and the second component beam has a second polarization that is different from the first polarization; a gain medium to: absorb a portion of the first component beam and a portion of the second component beam, and transmit an unabsorbed portion of the first component beam and an unabsorbed portion of the second component beam; and one or more optical elements to at least partially isolate a pump source from the unabsorbed portion of the first component beam and the unabsorbed portion of the second component beam.

According to some possible implementations, an optical pump may include: a first pump source to send pump light; a first beam displacer to separate the pump light into a first component beam having a first polarization and a second component beam having a second polarization, wherein the second polarization is different from the first polarization; a first polarization changer to change the first component beam from the first polarization to the second polarization; a gain medium to: absorb a portion of the first component beam and a portion of the second component beam, wherein the gain medium is to absorb the portion of the first component beam after the first component beam is changed from the first polarization to the second polarization, and transmit an unabsorbed portion the first component beam and an unabsorbed portion of the second component beam; a second polarization changer to change the unabsorbed portion of the first component beam from the second polarization to the first polarization; and a second beam displacer to displace the unabsorbed portion of the first component beam relative to the unabsorbed portion of the second component beam in order to at least partially isolate a second pump source from the unabsorbed portion of the first component beam and the unabsorbed portion of the second component beam.

According to some possible implementations, an optical pump may include: a pump source to send pump light; a beam displacer to separate the pump light into a first component beam having a first polarization and a second component beam having a second polarization, wherein the second polarization is different from the first polarization; a gain medium to: absorb a portion of the first component beam and a portion of the second component beam after separation by the beam displacer, transmit an unabsorbed portion of the first component beam and an unabsorbed portion of the second component beam, absorb a portion of the unabsorbed portion of the first component beam and a portion of the unabsorbed portion of the second component beam after reflection by a reflector, and transmit a remaining unabsorbed portion of the first component beam and a remaining unabsorbed portion of the second component beam; a first polarization changer to: change the first component beam from the first polarization to the second polarization after separation by the beam displacer; change the remaining unabsorbed portion of the first component beam from the first polarization to the second polarization after transmission by the gain medium; a second polarization changer to: change the unabsorbed portion of the first component beam and the unabsorbed portion of the second component beam from the second polarization to a third polarization after transmission by the gain medium and before reflection by the reflector, and change the unabsorbed portion of the first component beam and the unabsorbed portion of the second component beam from the third polarization to the first polarization after reflection by the reflector; and one or more optical elements to at least partially isolate the pump source from the remaining unabsorbed portion of the first component beam and the remaining unabsorbed portion of the second component beam.

BRIEF DESCRIPTION OF THE DRAWINGS

FIGS. 3A and 3B are diagrams of an example implementation of another optical pump that provides pump source isolation by polarization splitting.

FIGS. 4A and 4B are diagrams of an example implementation of an additional optical pump that provides pump source isolation by polarization splitting.

DETAILED DESCRIPTION

Figure 1:
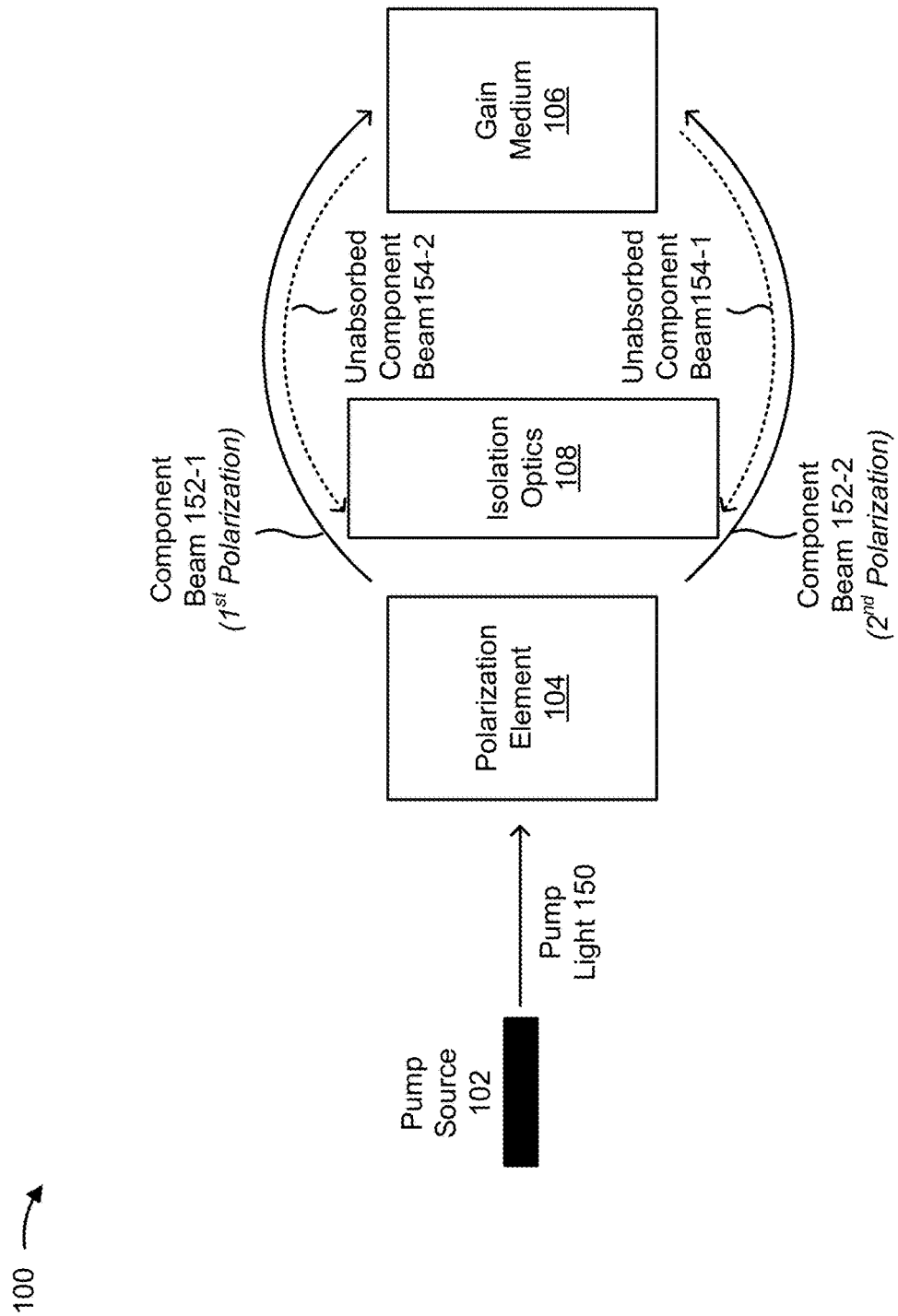
FIG. 1 is a diagram of an overview of an example optical pump described herein.

The following detailed description of example implementations refers to the accompanying drawings. The same reference numbers in different drawings may identify the same or similar elements. The implementations described below are merely examples and are not intended to limit the implementations to the precise forms disclosed. Instead, the implementations were selected for description to enable one of ordinary skill in the art to practice the implementations.

In some cases, an optical pump may be designed such that a gain medium is pumped from opposing sides. For example, the optical pump may be designed to image a first pump light source on a first side of the gain medium, and to image a second pump light source on a second side of the gain medium that is opposite to the first side. In some cases, the first and second pump light sources can be the same pump source or different pump sources.

In operation, the gain medium absorbs a portion of the first pump light and a portion of the second pump light, and transmits unabsorbed portions of the first and second pump light. For example, the gain medium may absorb approximately 80% of the first and second pump light, meaning that approximately 20% of both the first and second pump light is not absorbed and, thus, is transmitted by the gain medium. The unabsorbed portions of the pump light propagate back toward the pump source (e.g., since the pump source is imaged on the gain medium).

In some cases, given sufficient intensity, these unabsorbed portions of the first and second pump light can damage one or more elements of the optical pump (e.g., due to increased temperature, melting, machining, and/or the like, caused by the unabsorbed portions of the first and second pump light). For example, in a case where the first and second pump light are provided by the same pump source, the unabsorbed portions of the first and second pump light can propagate to the pump source, which can result in damage. Intentional misalignment will not help in such a case because the pump source is imaged into the gain medium, meaning that, after transmission, the unabsorbed portions will propagate back to the pump source. Similarly, in a case where the first and second pump light are provided by first and second pump sources, respectively, the unabsorbed portion of the first pump light can propagate to the second pump source and/or be reflected to the first pump source, and the unabsorbed portion of the second pump light can propagate to the first pump source and/or be reflected to the second pump source, any of which can result in damage.

The damage can occur on delivery optics associated with the optical pump, on an optical fiber associated with transporting pump light, on a source of the pump light (e.g., a laser diode chip), and/or the like. In some cases, the unabsorbed portions of the pump light can cause a laser diode to be unstable due to feedback, even without physical damage.

Given that pump light (e.g., provided by a multi-mode fiber) is typically unpolarized, one option to protect from such damage is to include polarization-insensitive Faraday isolators in the optical pump. However, these devices are expensive, are optically inefficient, and require a significant amount of physical space within the optical pump.

Some implementations described herein provide an optical pump that provides pump source isolation based on polarization splitting. Examples of optical pumps that provide pump source isolation based on polarization splitting are described below.

FIG. 1 is a diagram of an overview of an example optical pump 100 described herein. As shown in FIG. 1, optical pump 100 may include a pump source 102, a polarization element 104, a gain medium 106, and isolation optics 108.

As shown in FIG. 1, pump source 102 may provide pump light 150 (e.g., unpolarized light to be used for optical pumping) to polarization element 104. In some implementations, polarization element 104 may include an element to separate pump light 150 into a component beam with a first polarization (identified as component beam 152-1 in FIG. 1) and a component beam with a second polarization (identified as component beam 152-2 in FIG. 1). For example, polarization element may include a transmissive/reflective polarizer, a beam displacer, and/or the like, as described in further detail below. In some implementations, polarization element 104 may spatially separate component beam 152-1 and component beam 152-2.

In some implementations, component beam 152-1 may have a polarization that is substantially orthogonal to (e.g., 85° to 95° different from) a polarization of component beam 152-2. For example, component beam 152-1 may be s-polarized, and component beam 152-2 may be p-polarized. As another example, component beam 152-1 may be p-polarized, and component beam 152-2 may be s-polarized.

As further shown in FIG. 1, component beam 152-1 may be directed to a first side of gain medium 106, while component beam 152-2 may be directed to a second side (e.g., an opposite side) of gain medium 106. Gain medium 106 absorbs a portion of component beam 152-1 and a portion of component beam 152-2 (i.e., gain medium 106 is optically pumped by component beam 152-1 and component beam 152-2). As further shown, gain medium 106 may transmit an unabsorbed portion of component 152-1 (identified as unabsorbed component beam 154-1), and may transmit an unabsorbed portion of second component beam 152-2 (identified as unabsorbed component beam 154-2 in FIG. 1).

As further shown, unabsorbed component beams 154-1 and 154-2 may be directed to isolation optics 108. In some implementations, isolation optics 108 includes one or more optical elements to at least partially isolate a pump source (e.g., pump source 102) from unabsorbed component beam 154-1 and unabsorbed component beam 154-2. For example, isolation optics 108 may include one or more beam dumps, one or more mirrors, a beam displacer, and/or the like. In some implementations, isolation optics 108 may include polarization element 104, examples of which are provided below. In some implementations, isolation optics 108 provide isolation based on polarizations of unabsorbed component beams 154-1 and 154-2, as described in further detail below.

In this way, optical pump 100 may provide pump source isolation based on polarization splitting, thereby preventing damage to a pump source and/or improving stability of a laser diode associated with the pump source, and without requiring inclusion of expensive, optically inefficient, and/or relative large elements, such as Faraday isolators.

The number and arrangement of elements shown and described in association with FIG. 1 are provided as an example. In practice, optical pump 100 may include additional elements, fewer elements, different elements, differently sized elements, and/or differently arranged elements than those shown in FIG. 1. Further, optical pump 100 is provided as an overview of example features and capabilities of an optical pump that provides pump source isolation based on polarization splitting and, in some implementations, such an optical pump may include one or more other features or capabilities, examples of which are described below.

FIGS. 2A-2D are diagrams of an example implementation 200 of an optical pump 100 (herein referred to as optical pump 200) that provides pump source isolation by polarization splitting. FIGS. 2A-2D illustrate an example single-fiber implementation (e.g., an implementation in which optical pumping is provided by a single pump source 202).

Figure 2A:
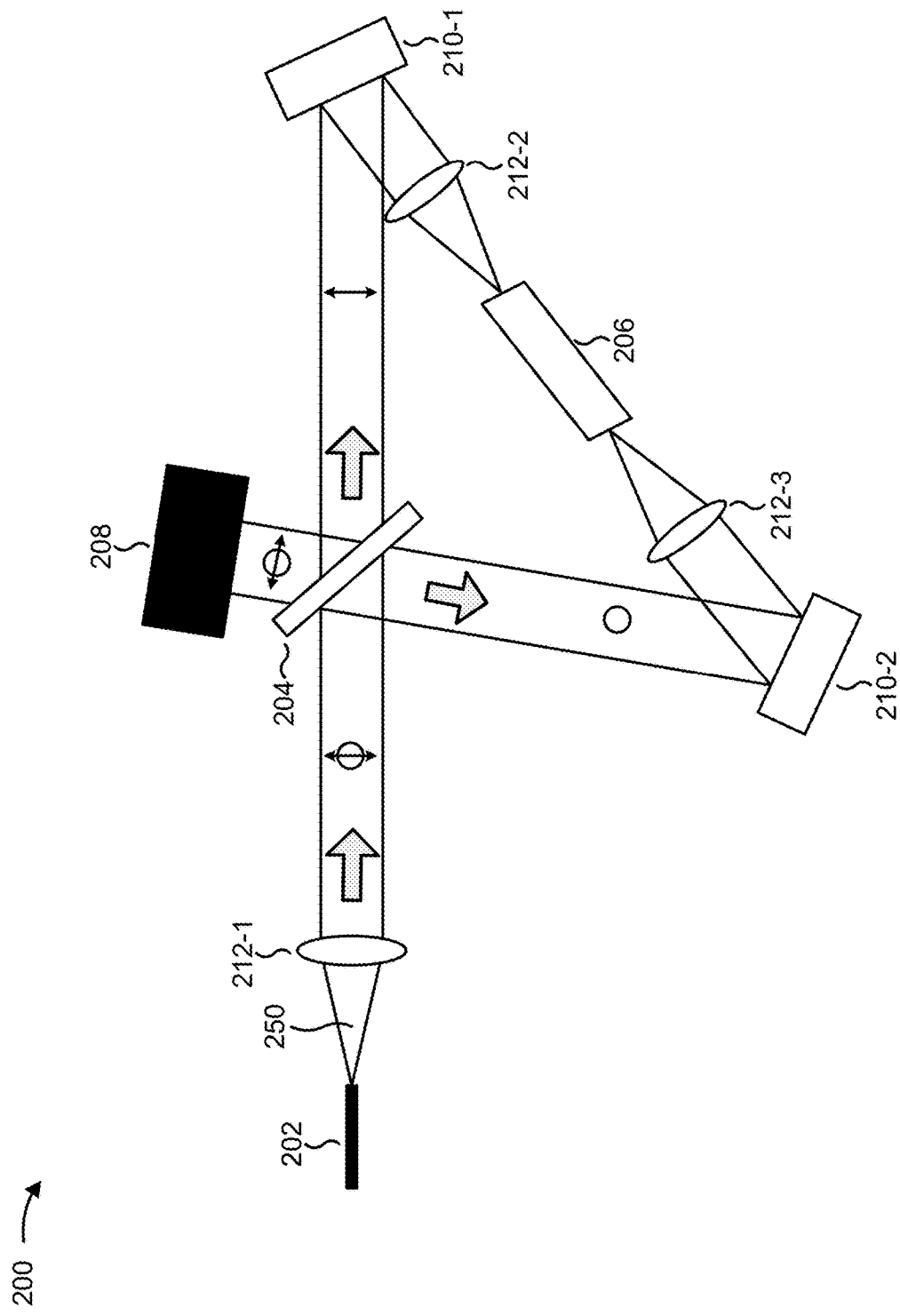
FIGS. 2A-2E are diagrams of an example implementation of an optical pump that provides pump source isolation by polarization splitting.

As shown in FIG. 2A, optical pump 200 may include a pump source 202, a transmissive/reflective (T/R) polarizer 204, a gain medium 206, a beam dump 208, a set of mirrors 210 (e.g., mirror 210-1 and mirror 210-2), and a set of lenses 212 (e.g., lens 212-1, lens 212-2, and lens 212-3).

Pump source 202 includes an element to send pump light 250 for use in providing optical pumping. For example, in some implementations, pump source 202 may include a laser diode, such as a distributed feedback (DFB) laser diode, a Fabry-Perot (FP) laser diode, and/or the like. In some implementations, pump source 202 may include an optical fiber that sends pump light 250 for pumping of gain medium 206, as described herein. In some implementations, a wavelength of pump light 250 may be less than a wavelength of signal light (e.g., an optical signal to be amplified by gain medium 206). In some implementations, pump light 250, sent by pump source 202, may have an optical power in a range from approximately 100 Watts (W) to approximately 1000 W, or more. In some implementations, pump source 202 corresponds to pump source 102.

T/R polarizer 204 includes an element to separate pump light 250 into a first component beam having a first polarization and a second component beam having a second polarization that is different from (e.g., substantially orthogonal to, approximately 85° to 95° different from) the first polarization. For example, T/R polarizer 204 may be configured to transmit light having the first polarization (e.g., a p-polarization, identified using a double-ended arrow in FIG. 2A) and to reflect light having the second polarization (e.g., an s-polarization, identified using a circle in FIG. 2A). Here, T/R polarizer 204 may receive pump light 250 (e.g., an unpolarized beam of light) sent by pump source 202, and may separate pump light 250 by transmitting a portion of pump light 250 with the first polarization and reflecting a portion of pump light 250 with the second polarization (thereby forming the first and second component beams), as described in the below examples. In some implementations, T/R polarizer 204 corresponds to polarization element 104 of FIG. 1.

In some implementations, T/R polarizer 204 may be arranged to transmit an unabsorbed portion of the first component beam and reflect an unabsorbed portion of the second component beam, as described in the below examples. Thus, in some implementations, T/R polarizer 204 may be included in or correspond to one of the one or more optical elements that at least partially isolate pump source 202 (e.g., T/R polarizer 204 may be included in isolation optics 108 of FIG. 1).

Gain medium 206 includes a gain medium (e.g., a crystal or a glass doped with rare earth ions or another type of laser-active ions, and/or the like) to be pumped by one or more components of pump light 250. As gain medium 206 adds energy to a signal light during operation (e.g., in order to amplify the signal light), gain medium 206 must receive energy, which can be provided by pumping gain medium 206 using one or more components of pump light 250, as described herein. In some implementations, gain medium 206 corresponds to gain medium 106 of FIG. 1.

Beam dump 208 includes an element to absorb a beam of light. For example, beam dump 208 may include a water-cooled metallic block comprising copper, aluminum, carbon, beryllium, tungsten, and/or the like, or another element to absorb a beam of light. In some implementations, beam dump 208 is arranged to absorb the unabsorbed portions of the first and second component beams, as described below in the below examples. Thus, in some implementations, beam dump 208 may be included in or correspond to one of the one or more optical elements that at least partially isolate pump source 202 (e.g., beam dump 208 may be included in isolation optics 108 of FIG. 1).

Mirror 210 includes a reflective element arranged to direct or steer one or more beams of light. In particular, in optical pump 200, mirror 210-1 is arranged to direct the first component beam and an unabsorbed portion of the second component beam, while mirror 210-2 is arranged to direct the second component beam and an unabsorbed portion of the first component beam, as described in the examples below.

Lens 212 includes a lens (e.g., a circular lens) to collimate one or more beams of light and/or focus one or more beams of light. In particular, in optical pump 200, lens 212-1 is arranged to collimate pump light 250, lens 212-2 is arranged to focus the first component beam and collimate the unabsorbed portion of the second component beam, and lens 212-3 is arranged to focus the second component beam and collimate the unabsorbed portion of the first component beam, as described in the below examples.

Figure 2B:
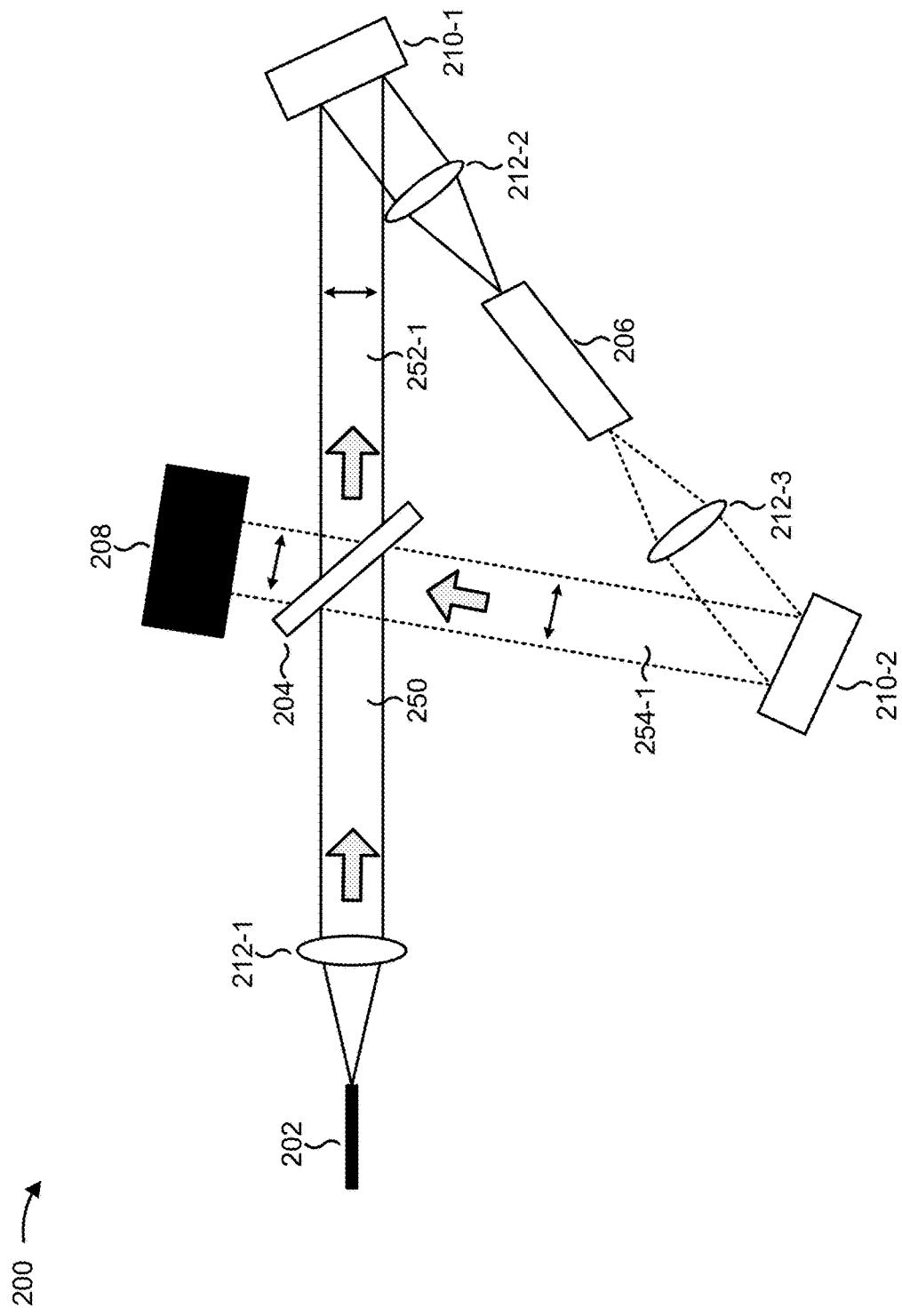
Figure 2C:
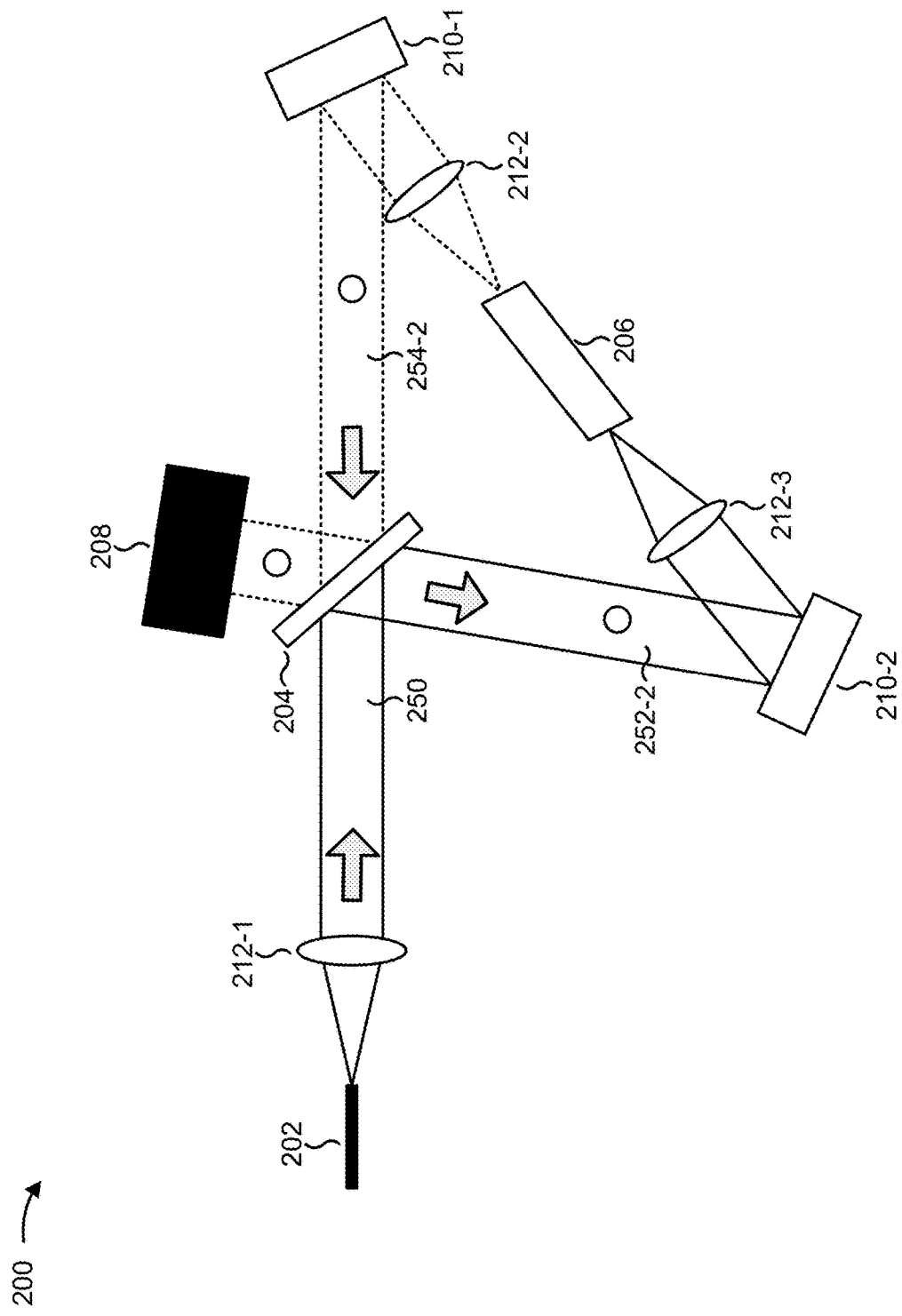

In an example operation of optical pump 200 is illustrated in FIGS. 2B and 2C. Pump light 250 is sent by pump source 202 and, after collimation by lens 212-1, propagates to T/R polarizer 204. As described above, T/R polarizer 204 separates pump light 250 into a first component beam having a first polarization and a second component beam having a second polarization. FIG. 2B illustrates an optical path of the first component beam (herein referred to as component beam 252-1), while FIG. 2C illustrates an optical path of the second component beam (herein referred to as component beam 252-2).

As shown in FIG. 2B, T/R polarizer 204 transmits component beam 252-1. Mirror 210-1 directs component beam 252-1 to lens 212-2, which focuses component beam 252-1 on a first side of gain medium 206 (e.g., a right side of gain medium 206). Gain medium 206 transmits an unabsorbed portion of component beam 252-1 (herein referred to as unabsorbed component beam 254-1, and identified using dashed lines in FIG. 2B), while, in the ideal case, perfectly preserving the polarization state of the light. Lens 212-3 collimates unabsorbed component beam 254-1, and mirror 210-2 directs unabsorbed component beam 254-1 to T/R polarizer 204. Here, since T/R polarizer 204 is configured to transmit light having the first polarization, T/R polarizer 204 transmits unabsorbed component beam 254-1. As shown, unabsorbed component beam 254-1 propagates to beam dump 208, which absorbs unabsorbed component beam 254-1.

As shown in FIG. 2C, T/R polarizer 204 reflects component beam 252-2. Mirror 210-2 directs component beam 252-2 to lens 212-3, which focuses component beam 252-2 on a second side of gain medium 206 (e.g., a left side of gain medium 206, which is opposite the first side of gain medium 206). Gain medium 206 transmits an unabsorbed portion of component beam 252-2 (herein referred to as unabsorbed component beam 254-2, and identified using dashed lines in FIG. 2C), while ideally preserving the polarization state of the light. Lens 212-2 collimates unabsorbed component beam 254-2, and mirror 210-1 directs unabsorbed component beam 254-2 to T/R polarizer 204. Here, since T/R polarizer 204 is configured to reflect light having the second polarization, T/R polarizer 204 reflects unabsorbed component beam 254-2. As shown, unabsorbed component beam 254-2 propagates to beam dump 208, which absorbs unabsorbed component beam 254-2.

In this way, pump source 202 may be isolated from unabsorbed component beam 254-1 and unabsorbed component beam 254-2 based on polarization splitting, thereby preventing damage to one or more elements of optical pump 200 and/or preventing operational instability associated with pump source 202.

In the case of an ideal T/R polarizer 204 (i.e., a T/R polarizer 204 that perfectly transmits and reflects light having the first and second polarizations, respectively), and an ideal polarization-preserving gain medium 206, pump source 202 would be perfectly isolated from unabsorbed component beam 254-1 and unabsorbed component beam 254-2. However, in practice, T/R polarizer 204 may be non-ideal, and gain medium 206 may degrade the polarization purity of the unabsorbed component beams, for example due to thermal stress, both of these effects resulting in a decreased level of isolation of pump source 202, but still an improvement over the prior art with no isolation. To improve the effectiveness of the scheme, a high-performance polarizer 204 can be selected, and the pump-polarization preservation of the gain medium 206 can be enhanced using techniques known in the art, such as selection of geometric design, symmetry axes, crystal type, crystallographic orientation, and pump-beam path.

Figure 2D:
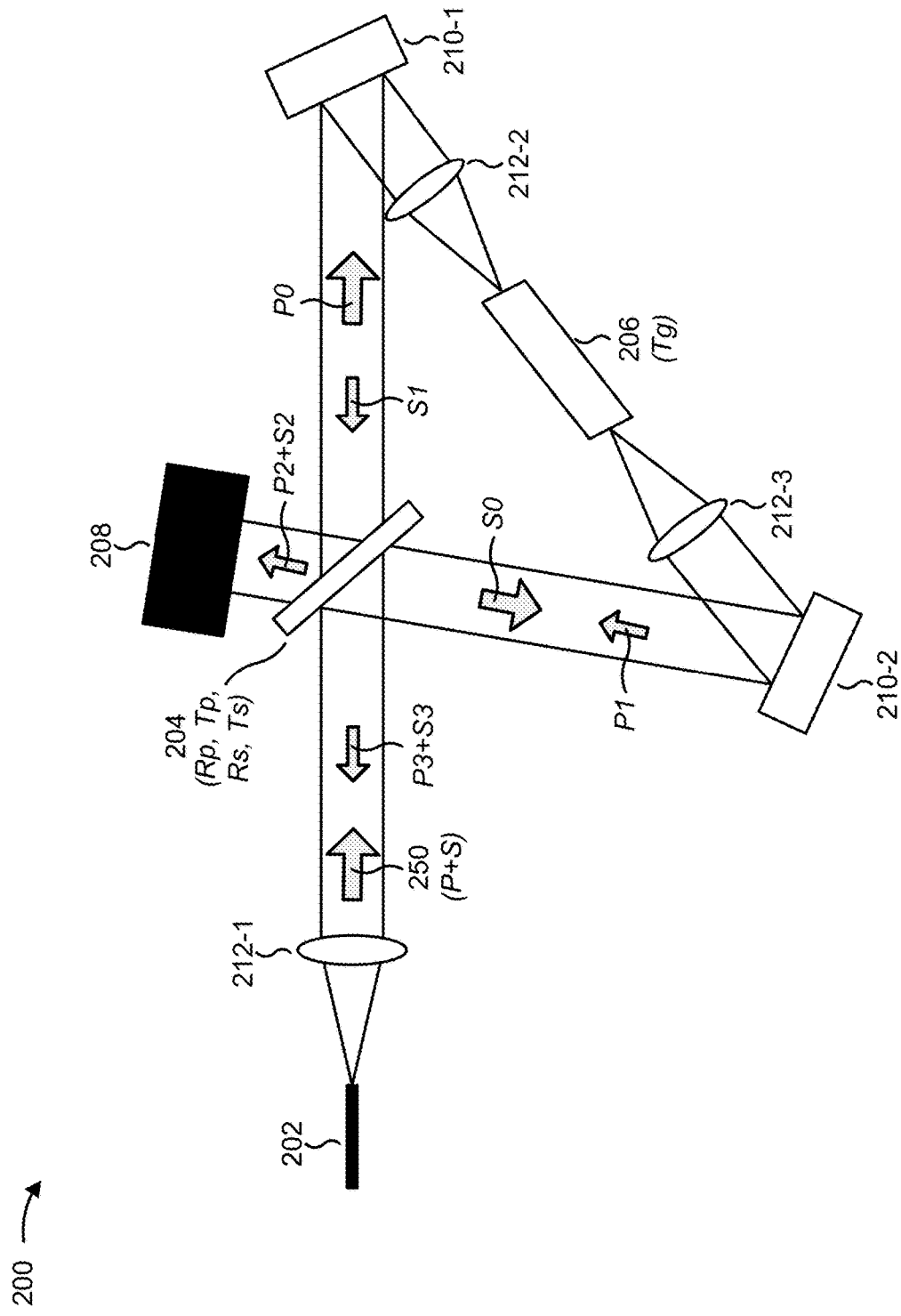

FIG. 2D is a diagram illustrating an example analysis associated with determining an amount of optical power that propagates back toward pump source 202. For the purposes of FIG. 2D, Rp and Tp represent the reflectivity and the transmission, respectively, of the first polarization (e.g., the p-polarization) by T/R polarizer 204. Similarly, Rs and Ts represent the reflectivity and the transmission, respectively, of the second polarization (e.g., the s-polarization) by T/R polarizer 204. Tg represents the transmission of gain medium 206.

As shown in FIG. 2D, total optical power of unpolarized pump light 250 (sent by pump source 202) is represented by P+S (e.g., P+S=1), where P is a portion of pump light 250 having the first polarization and S is a portion of pump light 250 having the second polarization. Further, since unpolarized pump light 250 can be described as having half of its optical power in the first polarization and half in the second polarization, P and S are both equal to one half of the optical power of pump light 250 (P=S=0.5).

Thus, with reference to FIG. 2D, an optical power of a portion of pump light 250 that is transmitted by T/R polarizer 204 (P0), and an optical power of a portion of pump light 250 that is reflected by T/R polarizer 204 (S0) can be formulated as:

$P0=0.5*(Tp+Ts)$; and $S0=0.5*(Rp+Rs)$.

Here, after absorption by gain medium 206, an optical power of an unabsorbed portion of transmitted pump light (P1) and an optical power of an unabsorbed portion of reflected pump light 250 (S1) can be formulated as:

$P1=P0*Tg=Tg/2*(Tp+Ts)$; and $S1=S0*Tg=Tg/2*(Rp+Rs)$.

As further shown, these beams propagate back to T/R polarizer 204. Here, an optical power of a portion of the unabsorbed portion of transmitted pump light 250 that is transmitted by T/R polarizer 204 (P2) and an optical power of a portion of the unabsorbed portion of reflected pump light 250 that is reflected by T/R polarizer 204 (52) can be formulated as:

$P2=Tg/2*(Tp^2+Ts^2)$; and $S2=Tg/2*(Rp^2+Rs^2)$.

Additionally, an optical power of a portion of the unabsorbed portion of transmitted pump light 250 that is reflected by T/R polarizer 204 (P3) and an optical power of a portion of the unabsorbed portion of reflected pump light 250 that is transmitted by T/R polarizer 204 (S3) can be formulated as:

$P3=Tg/2*(TpRp+TsRs)$; and $S3=Tg/2*(RpTp+RsTs)$.

Thus, a Total Optical Power of a Portion of Pump Light 250 that Propagates Back Toward Pump Source 202 can be Formulated as:

$P3+S3=Tg*(TpRp+TsRs)$.

As a particular example, assume that transmission of p-polarized light and reflectivity of s-polarized light by T/R polarizer 204 are 98% (e.g., Tp=Rs=0.98, Rp=Ts=0.02), and that gain medium 206 has a transmission of 20% (e.g., Tg=0.2). Thus, an optical power of a portion of pump light 250 that propagates back toward pump source 202 is 0.8% of the total input power (e.g., $0.2*((0.98*0.02)+(0.02*0.98))$ =0.008). Here, assuming 1000 Watts (W) of input power (such that gain medium 206 is pumped with 500 W on each side), 8 W of the input optical power propagates back toward pump source 202, which may be within an acceptable limit (e.g., such that the optical power is insufficient to damage optical pump 200 and/or cause instability).

Figure 2E:
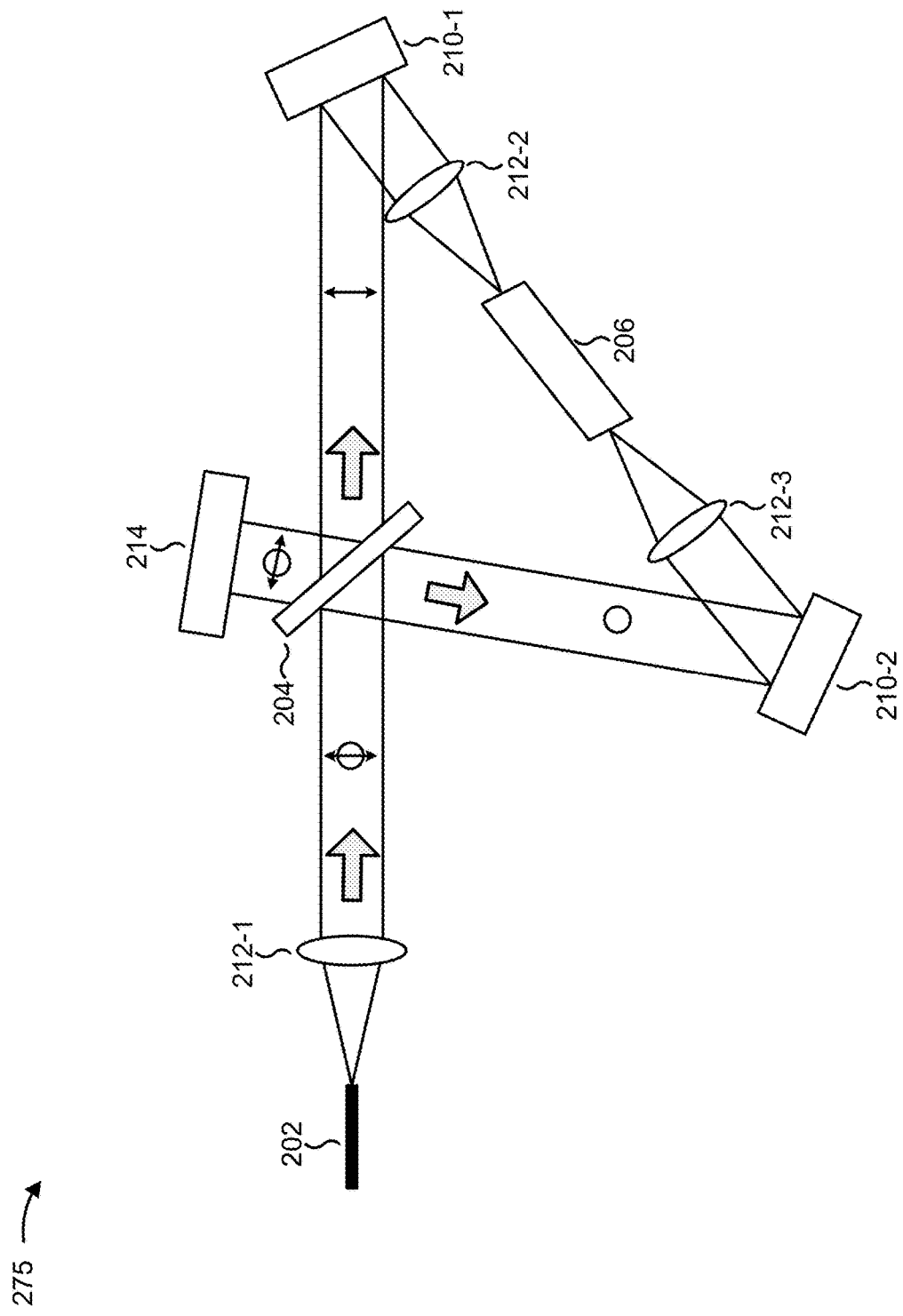

FIG. 2E is a diagram of an example implementation 275 of an optical pump 100 (herein referred to as optical pump 275) that provides pump source isolation by polarization splitting. As shown in FIG. 2E, elements of optical pump 275 may be similar to those included in optical pump 200. However, optical pump 275 includes a mirror 214 rather than beam dump 208.

Mirror 214 includes a reflective element to direct unabsorbed beams of light for further absorption by gain medium 206. For example, mirror 214 may direct unabsorbed component beam 254-1 (having the first polarization) and unabsorbed component beam 254-2 (having the second polarization) back to T/R polarizer 204. Here, T/R polarizer 204 may transmit unabsorbed component beam 254-1 and may reflect unabsorbed component beam 254-2 such that unabsorbed component beam 254-1 and unabsorbed component beam 254-2 propagate to opposite sides of gain medium 206.

In this way, each polarized beam may be double-passed through gain medium 206, thereby increasing optical efficiency of optical pump 275 (e.g., as compared to optical pump 200). However, isolation of pump source 202 may be decreased since an unabsorbed portion of unabsorbed component beam 254-1 (i.e., a portion of unabsorbed component beam 254-1 that is unabsorbed after unabsorbed component beam 254-1 passes through gain medium 206) and an unabsorbed portion of unabsorbed component beam 254-2 (i.e., a portion of unabsorbed component beam 254-2 that is unabsorbed after unabsorbed component beam 254-2 passes through gain medium 206) propagates back toward pump source 202.

In some implementations, gain medium 206 may include a coating on one or more surfaces of gain medium 206. Taking optical pump 200 as an example, gain medium 206 may include a first coating on the right side (e.g., a right surface) that is designed to transmit light having the first polarization and reflect light having the second polarization, and may include a second coating on the left side (e.g., a left surface) that is designed to transmit light having the second polarization and reflect light having the first polarization. Here, component beam 252-1 enters gain medium 206 from the right side (by transmission through the first coating), passes through gain medium 206, and an unabsorbed portion is reflected back (by the second coating) into gain medium 206 for further absorption, thereby increasing optical efficiency. Similarly, component beam 252-2 enters gain medium 206 from the left side (by transmission through the second coating), passes through gain medium 206, and an unabsorbed portion is reflected back (by the first coating) into gain medium 206 for further absorption, thereby increasing optical efficiency. In this example, both the first and second coatings may be designed for high transmission at a seed wavelength (e.g., a wavelength of signal light to be amplified by gain medium 206) and a seed incidence angle (e.g., an incidence angle of the signal light).

The number and arrangement of elements shown and described in association with FIGS. 2A-2E are provided as examples. In practice, optical pump 200 and/or optical pump 275 may include additional elements, fewer elements, different elements, differently sized elements, and/or differently arranged elements than those shown in FIGS. 2A-2E.

FIGS. 3A and 3B are diagrams of an example implementation 300 of an optical pump 100 (herein referred to as optical pump 300) that provides pump source isolation by polarization splitting. FIGS. 3A and 3B illustrate an example two-fiber implementation (e.g., an implementation in which optical pumping is provided by two pump sources 202).

As shown in FIGS. 3A and 3B, optical pump 300 may include a pair of pump sources 202 (e.g., pump source 202-1 and pump source 202-2), a gain medium 206, a pair of beam dumps 208 (e.g., beam dump 208-1 and beam dump 208-2), a set of lenses 212 (e.g., lens 212-1, lens 212-2, lens 212-3, and lens 212-4), a pair of beam displacers 216 (e.g., beam displacer 216-1 and beam displacer 216-2), and a pair of polarization changers 218 (e.g., polarization changer 218-1 and polarization changer 218-2).

Pump source 202-1, pump source 202-2, gain medium 206, beam dump 208-1, beam dump 208-2, and lenses 212 may be similar to those described above in association with optical pump 200. Notably, the elements of optical pump 300 are arranged such that gain medium 206 is pumped from opposing sides by different pump sources 202 (rather than a single pump source, as shown in optical pump 200).

Beam displacer 216 includes an element to separate pump light 250 into a first component beam having a first polarization (e.g., component beam 252-1) and a second component beam having a second polarization (e.g., component beam 252-2). For example, beam displacer 216 may comprise a birefringent material that displaces light having the first polarization (e.g., a p-polarization, identified using a vertical line in FIGS. 3A and 3B) relative to light having the second polarization (e.g., an s-polarization, identified using a circle in FIGS. 3A and 3B). For example, beam displacer 216 may transmit both the first component and the second component where the first component is laterally displaced while the second component is not laterally displaced. Thus, as pump light 250 passes through beam displacer 216, spatial separation is created between differently polarized light such that component beam 252-1 and component beam 252-2 are transmitted by beam displacer 216. In some implementations, beam displacer 216 may be a beam displacer, a thin-film polarizer, a Wollaston prism, a Rochon prism, or another type of beam-splitting polarizer.

In some implementations, beam displacer 216 may receive pump light 250 (e.g., an unpolarized beam of light) sent by pump source 202, and may separate pump light 250 by displacing a portion of pump light 250 with the first polarization and transmitting a portion of pump light 250 with the second polarization, without displacement, as described in the below examples. In some implementations, beam displacer 216 corresponds to polarization element 104 of FIG. 1.

In some implementations, beam displacer 216 may be arranged to displace an unabsorbed portion of the first component beam and transmit (without displacement) an unabsorbed portion of the second component beam, as described in the below examples. Thus, in some implementations, beam displacer 216 may be included in or correspond to one of the one or more optical elements that at least partially isolate pump source 202 (e.g., beam displacer 216 may be included in isolation optics 108 of FIG. 1).

Polarization changer 218 includes an element to change a polarization of a beam of light. For example, polarization changer 218 may be a waveplate, a polarization rotator, or another type of element that changes polarization of a beam of light. In some implementations, polarization changer 218 may rotate a given beam of light from a given polarization to a polarization that is orthogonal to the given polarization. For example, polarization changer 218 may include a half waveplate that changes polarization of a beam of light from the first polarization to the second polarization, or from the second polarization to the first polarization, as described in the below examples.

An example operation of optical pump 300 is illustrated in FIGS. 3A and 3B. FIG. 3A illustrates optical paths associated with pump light 250-1 provided by pump source 202-1 (e.g., from left to right in FIG. 3A), while FIG. 3B illustrates optical paths associated with pump light 250-2 provided by pump source 202-2 (e.g., from right to left in FIG. 3B).

As shown in FIG. 3A, pump source 202-1 sends pump light 250-1 which, after collimation by lens 212-1, propagates to a left side of beam displacer 216-1. As shown, as pump light 250-1 passes through beam displacer 216-1, beam displacer 216-1 separates pump light 250-1 into component beam 252-1 (having a first polarization, represented by a vertical line) and component beam 252-2 (having a second polarization, represented by a circle). As shown component beam 252-1 is displaced such that component beam 252-1 is substantially parallel to component beam 252-2 when transmitted by beam displacer 216-1 (e.g., from a right side of beam displacer 216-1).

As further shown in FIG. 3A, component beam 252-1 propagates to polarization changer 218-1, which rotates component beam 252-1 from the first polarization to the second polarization. Component beam 252-1 (now having the second polarization) and component beam 252-2 are focused by lens 212-2 on gain medium 206 (e.g., a left side of gain medium 206). Gain medium 206 transmits (e.g., from a right side of gain medium 206) unabsorbed component beam 254-1 and unabsorbed component beam 254-2, while ideally preserving the polarization state of these beams in the second polarization. Lens 212-3 collimates unabsorbed component beam 254-1 and unabsorbed component beam 254-2.

As further shown in FIG. 3A, unabsorbed component beam 254-1 propagates to polarization changer 218-2, which rotates unabsorbed component beam 254-1 from the second polarization back to the first polarization. Unabsorbed component beam 254-1 (now having the first polarization) and unabsorbed component beam 254-2 (still having the second polarization) propagate to beam displacer 216-2. As further shown, beam displacer 216-2 displaces unabsorbed component beam 254-1 and transmits unabsorbed component beam 254-2, without displacement, such that further spatial separation is created between unabsorbed component beam 254-1 and unabsorbed component beam 254-2. As further shown, unabsorbed component beam 254-1 and unabsorbed component beam 254-2 propagate to beam dump 208-1, which absorbs unabsorbed component beam 254-1 and unabsorbed component beam 254-2, thereby isolating pump source 202-2 and pump source 202-1 (e.g., from back reflection through optical pump 300).

As shown in FIG. 3B, pump source 202-2 sends pump light 250-2 which, after collimation by lens 212-4, propagates to a right side of beam displacer 216-2. As shown, as pump light 250-2 passes through beam displacer 216-2, beam displacer 216-2 separates pump light 250-2 into component beam 252-3 (having the first polarization) and component beam 252-4 (having the second polarization). As shown component beam 252-3 is displaced such that component beam 252-3 is substantially parallel to component beam 252-4 when transmitted by beam displacer 216-2 (e.g., from a left side of beam displacer 216-2).

As further shown in FIG. 3B, component beam 252-4 propagates to polarization changer 218-2, which rotates component beam 252-4 from the second polarization to the first polarization. Component beam 252-4 (now having the first polarization) and component beam 252-3 are focused by lens 212-3 on gain medium 206 (e.g., the right side of gain medium 206). Gain medium 206 transmits (e.g., from the left side of gain medium 206) unabsorbed component beam 254-3 and unabsorbed component beam 254-4, while ideally preserving the polarization state of these beams in the first polarization. Lens 212-2 collimates unabsorbed component beam 254-3 and unabsorbed component beam 254-4.

As further shown in FIG. 3B, unabsorbed component beam 254-4 propagates to polarization changer 218-1, which rotates unabsorbed component beam 254-4 from the first polarization back to the second polarization. Unabsorbed component beam 254-4 (now having the second polarization) and unabsorbed component beam 254-3 (still having the first polarization) propagate to beam displacer 216-1. As further shown, beam displacer 216-1 displaces unabsorbed component beam 254-3 and transmits unabsorbed component beam 254-4, without displacement, such that further spatial separation is created between unabsorbed component beam 254-3 and unabsorbed component beam 254-4. As further shown, unabsorbed component beam 254-3 and unabsorbed component beam 254-4 propagate to beam dump 208-2, which absorbs unabsorbed component beam 254-3 and unabsorbed component beam 254-4, thereby isolating pump source 202-1 and pump source 202-2 (e.g., from back reflection through optical pump 300).

The number and arrangement of elements shown and described in association with FIGS. 3A and 3B are provided as examples. In practice, optical pump 300 may include additional elements, fewer elements, different elements, differently sized elements, and/or differently arranged elements than those shown in FIGS. 3A and 3B.

For example, in some implementations, optical pump 300 may include polarizers between gain medium 206 and polarization changer 218 in order to reject unabsorbed component beam 254 (e.g., in order to keep transmitted pump radiation out of polarization changer 218 and beam displacer 216). As another example, in some implementations, optical pump 300 may include mirror 214 rather than beam dump 208 in order to provide double-passing functionality, as described above.

FIGS. 4A and 4B are diagrams of an example implementation 400 of an optical pump 100 (herein referred to as optical pump 400) that provides pump source isolation by polarization splitting. FIGS. 4A and 4B illustrate another example single-fiber implementation.

As shown in FIGS. 4A and 4B, optical pump 400 may include a pump source 202, a gain medium 206, a beam dump 208, a set of lenses 212 (e.g., lens 212-1 and lens 212-2), a beam displacer 216, a polarization changer 218, a polarization changer 220, and a reflector 222.

Pump source 202, gain medium 206, beam dump 208, lenses 212, beam displacer 216, and polarization changer 218 may be similar to those described above in association with optical pumps 200 and 300. Notably, the elements of optical pump 400 are arranged such that gain medium 206 is pumped from opposing sides by the same pump source 202 using a double-passing technique.

Polarization changer 220 includes an element to change a polarization of a beam of light. For example, polarization changer 220 may be a waveplate, a polarization rotator, or another type of element that changes polarization of a beam of light. In some implementations, polarization changer 220 may rotate a given beam of light from the first polarization to a third polarization that is between the first and second polarizations. For example, polarization changer 220 may include a quarter waveplate that changes polarization of a beam of light from the first polarization to a third polarization (e.g., a polarization is halfway between the first and second polarizations, such that the polarization is rotated by approximately 45°), from the third polarization to the second polarization, from the second polarization to the third polarization, or from the third polarization to the first polarization.

Reflector 222 includes a reflective element to reflect unabsorbed beams of light for further absorption by gain medium 206. For example, reflector 222 may reflect unabsorbed component beam 254-1 and unabsorbed component beam 254-2 for double-passing through polarization changer 220 and gain medium 206, as described below.

An example operation of optical pump 400 is shown in FIGS. 4A and 4B. FIG. 4A illustrates optical paths associated with a first pass of pump light 250 through gain medium 206 (e.g., from left to right in FIG. 4A), while FIG. 4B illustrates optical paths associated with a second pass of pump light 250 through gain medium 206 (e.g., from right to left in FIG. 4B).

As shown in FIG. 4A, pump source 202 sends pump light 250 which, after collimation by lens 212-1, propagates to a left side of beam displacer 216. As shown, as pump light 250 passes through beam displacer 216, beam displacer 216 separates pump light 250 into component beam 252-1 (having a first polarization, represented by a vertical line) and component beam 252-2 (having a second polarization, represented by a circle). As shown component beam 252-1 is displaced such that component beam 252-1 is substantially parallel to component beam 252-2 when transmitted by beam displacer 216-1 (e.g., from a right side of beam displacer 216-1).

As further shown in FIG. 4A, component beam 252-1 propagates to polarization changer 218, which rotates component beam 252-1 from the first polarization to the second polarization. Component beam 252-1 (now having the second polarization) and component beam 252-2 are focused by lens 212-2 on gain medium 206 (e.g., a left side of gain medium 206). Gain medium 206 transmits (e.g., from a right side of gain medium 206) unabsorbed component beam 254-1 and unabsorbed component beam 254-2 (not shown).

Here, both unabsorbed component beam 254-1 and unabsorbed component beam 254-2 pass through polarization changer 220, which rotates the polarization of unabsorbed component beam 254-1 and unabsorbed component beam 254-2 from the second polarization to a third polarization that is halfway between the second polarization and the first polarization. Next, unabsorbed component beam 254-1 and unabsorbed component beam 254-2 (both having the third polarization) are reflected by reflector 222, and once again pass through polarization changer 220. Polarization changer 220 rotates the polarization of unabsorbed component beam 254-1 and unabsorbed component beam 254-2 from the third polarization to the first polarization. Unabsorbed component beam 254-1 and unabsorbed component beam 254-2 (both having the first polarization) pass through gain medium 206 (e.g., from right to left).

Thus, as shown in FIG. 4B, gain medium 206 transmits (e.g., from the left side of gain medium 206) a remaining unabsorbed portion of component beam 252-1 (i.e., an unabsorbed portion of unabsorbed component beam 254-1, identified as remaining unabsorbed component beam 256-1) and a remaining unabsorbed portion of component beam 252-2 (i.e., an unabsorbed portion of unabsorbed component beam 254-2, identified as remaining unabsorbed component beam 256-2), while ideally preserving the polarization state of these beams in the first polarization.

As further shown, lens 212-2 collimates remaining unabsorbed component beam 256-1 and remaining unabsorbed component beam 256-2. Next, remaining unabsorbed component beam 256-1 propagates to polarization changer 218, which rotates remaining unabsorbed component beam 256-1 from the first polarization to the second polarization. Remaining unabsorbed component beam 256-1 (now having the second polarization) and remaining unabsorbed component beam 256-2 (having the first polarization) propagate to beam displacer 216. As further shown, beam displacer 216 displaces remaining unabsorbed component beam 256-2 and transmits remaining unabsorbed component beam 256-1, without displacement, such that further spatial separation is created between remaining unabsorbed component beam 256-1 and remaining unabsorbed component beam 256-2. As further shown, remaining unabsorbed component beam 256-1 and remaining unabsorbed component beam 256-2 propagate to beam dump 208, which absorbs these beams, thereby isolating pump source 202.

The number and arrangement of elements shown and described in association with FIGS. 4A and 4B are provided as examples. In practice, optical pump 400 may include additional elements, fewer elements, different elements, differently sized elements, and/or differently arranged elements than those shown in FIGS. 4A and 4B. For example, in some implementations, optical pump 400 may include mirror 214 rather than beam dump 208 in order to provide further additional passes through gain medium 206, as described above.

Some implementations described herein provide an optical pump (e.g., optical pump 100, optical pump 200, optical pump 275, optical pump 300, and/or optical pump 400) that provides pump source isolation based on polarization splitting, thereby preventing damage to a pump source and/or improving stability of a laser diode associated with the pump source.

The foregoing disclosure provides illustration and description, but is not intended to be exhaustive or to limit the implementations to the precise form disclosed. Modifications and variations are possible in light of the above disclosure or may be acquired from practice of the implementations.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related items, and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. An optical pump, comprising:
   a polarization element configured to:
      separate unpolarized pump light into a first component beam and a second component beam,
         wherein the polarization element is to separate the unpolarized pump light such that the first component beam has a first polarization and the second component beam has a second polarization that is different from the first polarization;
   a gain medium configured to:
      absorb a portion of the first component beam and a portion of the second component beam, and
      transmit an unabsorbed portion of the first component beam and an unabsorbed portion of the second component beam; and
   one or more optical elements configured to:
      at least partially isolate a pump source from the unabsorbed portion of the first component beam and the unabsorbed portion of the second component beam, and
      absorb the unabsorbed portion of the first component beam and the unabsorbed portion of the second component beam.

2. The optical pump of claim 1, wherein the first polarization is substantially orthogonal to the second polarization.

3. The optical pump of claim 1, wherein the one or more optical elements include a beam dump configured to absorb the unabsorbed portion of the first component beam and the unabsorbed portion of the second component beam.

4. The optical pump of claim 1, wherein the gain medium comprises a first surface with a first coating and a second surface with a second coating,
   wherein the first surface is opposite to the second surface,
   wherein the first coating is configured to at least partially transmit light having the first polarization and at least partially reflect light having the second polarization, and
   wherein the second coating is configured to at least partially transmit light having the second polarization and at least partially reflect light having the first polarization.

5. The optical pump of claim 1, wherein the one or more optical elements include a mirror configured to direct the unabsorbed portion of the first component beam and the unabsorbed portion of the second component beam for further absorption by the gain medium.

6. The optical pump of claim 1, wherein the polarization element is a polarizer configured to transmit light having the first polarization, and reflect light having the second polarization.

7. The optical pump of claim 1, wherein the polarization element is a beam displacer configured to displace light having the first polarization relative to light having the second polarization.

8. The optical pump of claim 1, wherein the one or more optical elements include a beam displacer configured to displace light having the first polarization, relative to light having the second polarization.

9. The optical pump of claim 1, wherein the one or more optical elements include the polarization element.

10. The optical pump of claim 1, further comprising:
a first polarization changer configured to change the first component beam from the first polarization to the second polarization before the gain medium absorbs the portion of the first component beam, and
a second polarization changer configured to change the unabsorbed portion of the first component beam from the second polarization to the first polarization after transmission by the gain medium.

11. The optical pump of claim 10, wherein the first polarization changer and the second polarization changer are half waveplates.

12. The optical pump of claim 1, further comprising:
a reflector configured to reflect the unabsorbed portion of the first component beam and the unabsorbed portion of the second component beam for further absorption by the gain medium;
the gain medium configured to:
absorb a portion of the unabsorbed portion of the first component beam and a portion of the unabsorbed portion of the second component beam, and
transmit a remaining unabsorbed portion of the first component beam and a remaining unabsorbed portion of the second component beam;
a first polarization changer configured to:
change the first component beam from the first polarization to the second polarization after separation by the polarization element, and
change the remaining unabsorbed portion of the first component beam from the first polarization to the second polarization after transmission by the gain medium; and
a second polarization changer configured to:
change the unabsorbed portion of the first component beam from the second polarization to a third polarization after transmission by the gain medium and before reflection by the reflector, and
change the unabsorbed portion of the first component beam from the third polarization to the first polarization after reflection by the reflector; and
wherein the one or more optical elements, to absorb the unabsorbed portion of the first component beam and the unabsorbed portion of the second component beam, are configured to:
absorb the remaining unabsorbed portion of the first component beam and the remaining unabsorbed portion of the second component beam.

13. The optical pump of claim 12, wherein the first polarization changer is a half waveplate and the second polarization changer is a quarter waveplate.

14. An optical pump, comprising:
a first pump source configured to send pump light;
a first beam displacer configured to separate the pump light into a first component beam having a first polarization and a second component beam having a second polarization,
wherein the second polarization is different from the first polarization;
a first polarization changer configured to change the first component beam from the first polarization to the second polarization;
a gain medium configured to:
absorb a portion of the first component beam and a portion of the second component beam,
wherein the gain medium is configured to absorb the portion of the first component beam after the first component beam is changed from the first polarization to the second polarization, and
transmit an unabsorbed portion of the first component beam and an unabsorbed portion of the second component beam;
a second polarization changer configured to change the unabsorbed portion of the first component beam from the second polarization to the first polarization; and
a second beam displacer configured to displace the unabsorbed portion of the first component beam relative to the unabsorbed portion of the second component beam in order to at least partially isolate a second pump source from the unabsorbed portion of the first component beam and the unabsorbed portion of the second component beam.

15. The optical pump of claim 14, wherein the first polarization is substantially orthogonal to the second polarization.

16. The optical pump of claim 14, further comprising a beam dump configured to absorb the unabsorbed portion of the first component beam and the unabsorbed portion of the second component beam after displacement of the unabsorbed portion of the first component beam and transmission of the unabsorbed portion of the second component beam by the second beam displacer.

17. The optical pump of claim 14, wherein the pump light is first pump light;
wherein the optical pump further comprises:
the second pump source configured to send second pump light;
the second beam displacer configured to separate the second pump light into a third component beam having the first polarization and a fourth component beam having the second polarization; and
the second polarization changer configured to change the fourth component beam from the second polarization to the first polarization;
wherein the gain medium is further configured to:
absorb a portion of the third component beam and a portion of the fourth component beam,
wherein the gain medium is further configured to absorb the portion of the fourth component beam after the fourth component beam is changed from the second polarization to the first polarization, and
transmit an unabsorbed portion of the third component beam and an unabsorbed portion of the fourth component beam;

wherein the first polarization changer is further configured to change the unabsorbed portion of the fourth component beam from the first polarization to the second polarization; and wherein the first beam displacer is further configured to displace the unabsorbed portion of the third component beam relative to the unabsorbed portion of the fourth component beam in order to at least partially isolate the first pump source from the unabsorbed portion of the third component beam and the unabsorbed portion of the fourth component beam.

18. The optical pump of claim 17, further comprising a beam dump configured to absorb the unabsorbed portion of the third component beam and the unabsorbed portion of the fourth component beam after displacement of the unabsorbed portion of the third component beam and transmission of the unabsorbed portion of the fourth component beam by the first beam displacer.

19. An optical pump, comprising:
a pump source configured to send unpolarized pump light;
a beam displacer configured to separate the unpolarized pump light into a first component beam having a first polarization and a second component beam having a second polarization,
wherein the second polarization is different from the first polarization;
a gain medium configured to:
absorb a portion of the first component beam and a portion of the second component beam after separation by the beam displacer,
transmit an unabsorbed portion of the first component beam and an unabsorbed portion of the second component beam,
absorb a portion of the unabsorbed portion of the first component beam and a portion of the unabsorbed portion of the second component beam after reflection by a reflector, and
transmit a remaining unabsorbed portion of the first component beam and a remaining unabsorbed portion of the second component beam;
a first polarization changer configured to:
change the first component beam from the first polarization to the second polarization after separation by the beam displacer;
change the remaining unabsorbed portion of the first component beam from the first polarization to the second polarization after transmission by the gain medium;
a second polarization changer configured to:
change the unabsorbed portion of the first component beam from the second polarization to a third polarization after transmission by the gain medium and before reflection by the reflector, and
change the unabsorbed portion of the first component beam from the third polarization to the first polarization after reflection by the reflector; and
one or more optical elements configured to:
at least partially isolate the pump source from the remaining unabsorbed portion of the first component beam and the remaining unabsorbed portion of the second component beam, and
absorb the remaining unabsorbed portion of the first component beam and the remaining unabsorbed portion of the second component beam.

20. The optical pump of claim 19, wherein the one or more optical elements include the beam displacer.

* * * * *